United States Patent [19]
Albright et al.

[11] Patent Number: 5,385,614
[45] Date of Patent: Jan. 31, 1995

[54] SERIES INTERCONNECTED PHOTOVOLTAIC CELLS AND METHOD FOR MAKING SAME

[75] Inventors: Scot P. Albright; Rhodes R. Chamberlin, both of El Paso, Tex.; Roger A. Thompson, Littleton, Colo.

[73] Assignee: Photon Energy Inc., Golden, Colo.

[21] Appl. No.: 58,653

[22] Filed: May 6, 1993

[51] Int. Cl.⁶ .................. H01L 31/05; H01L 31/18
[52] U.S. Cl. .................. 136/244; 437/2; 437/4; 437/5; 437/51; 437/205
[58] Field of Search .................. 437/2-5, 437/51, 205; 136/244, 249 MS

[56] References Cited

U.S. PATENT DOCUMENTS

| | | | |
|---|---|---|---|
| 4,243,432 | 1/1981 | Jordan et al. | 136/244 |
| 4,313,022 | 1/1982 | Jordan et al. | 136/244 |
| 4,532,371 | 6/1985 | Hanak et al. | 136/249 |
| 4,668,840 | 5/1987 | Kiyama et al. | 136/244 |
| 4,726,849 | 2/1988 | Murata et al. | 136/244 |
| 4,758,526 | 7/1988 | Thalheimer | 427/2 |
| 4,854,974 | 8/1989 | Carlson et al. | 136/244 |

FOREIGN PATENT DOCUMENTS 60-31258  2/1985  Japan .................. 136/244

Primary Examiner—Aaron Weisstuch
Attorney, Agent, or Firm—Sheridan Ross & McIntosh

[57] ABSTRACT

A novel photovoltaic module (10) and method for constructing the same are disclosed. The module (10) includes a plurality of photovoltaic cells (12) formed on a substrate (14) and laterally separated by interconnection regions (15). Each cell (12) includes a bottom electrode (16), a photoactive layer (18) and a top electrode layer (20). Adjacent cells (12) are connected in electrical series by way of a conductive-buffer line (22). The buffer line (22) is also useful in protecting the bottom electrode (16) against severing during downstream layer cutting processes.

44 Claims, 5 Drawing Sheets

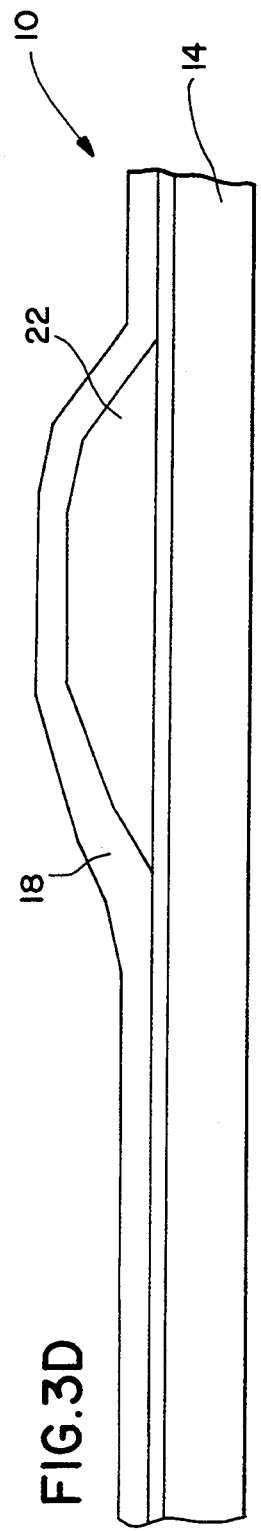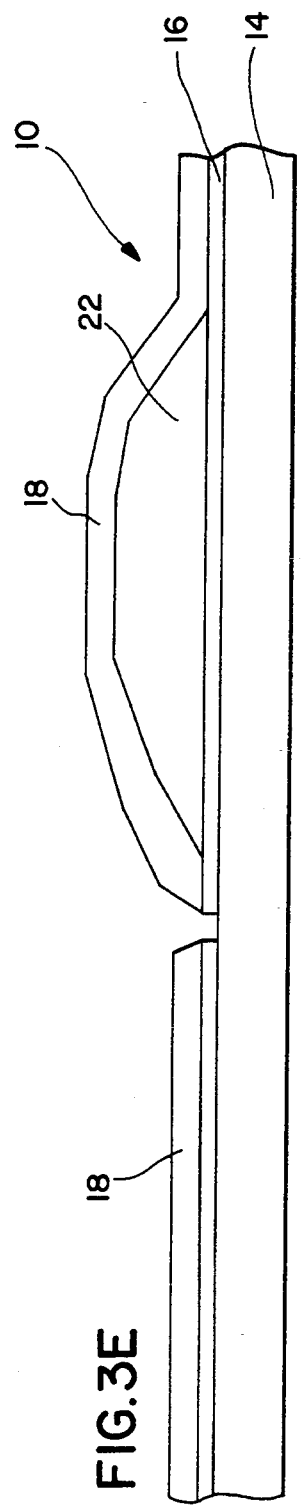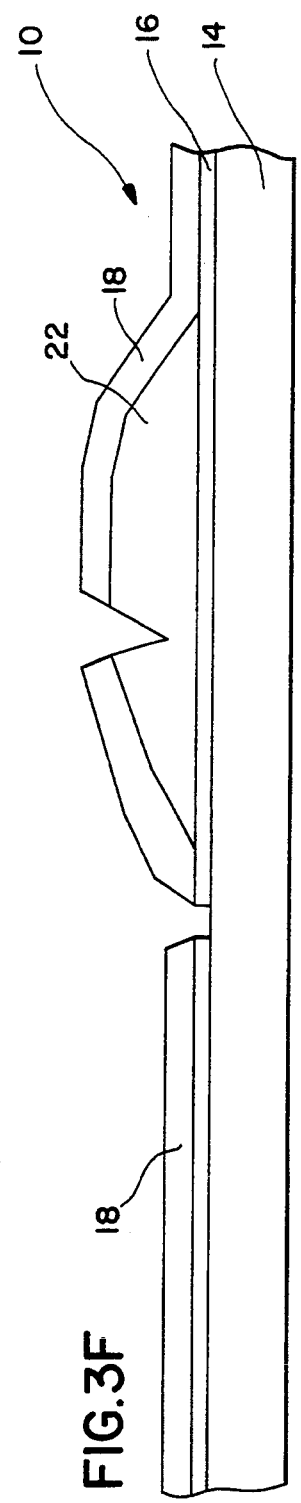

SERIES INTERCONNECTED PHOTOVOLTAIC CELLS AND METHOD FOR MAKING SAME

This invention was made with Government support under Contract No. DE-AC02-83CH10093 awarded by the Department of Energy. The Government has certain rights in this invention.

FIELD OF THE INVENTION

The present invention relates generally to photovoltaic modules and, in particular, to series interconnected photovoltaic cells and a method for forming individual cells of a photovoltaic module and interconnecting adjacent cells in electrical series.

BACKGROUND OF THE INVENTION

Referring to FIG. 1, a schematic, cross-sectional view of a portion of a conventional photovoltaic module 1 is shown. The module 1 includes a number of photovoltaic cells 2 formed on substrate 3. Generally, each cell 2 has a first transparent electrode layer 4, a photoactive layer 5, including a p-type absorber-generator sublayer and an n-type, collector-converter sublayer, and a second electrode layer 6 which can be formed from metal.

Sunlight passes through the substrate 3 and the first, transparent electrode layer 4 and is converted to electricity in the photoactive layer 5. Electrical current thus generated flows between adjacent cells 2 via electrode portions 7 which extend across interconnect region 8. As shown, the cells 2 are connected in electrical series, i.e., the "top" electrode of one cell 2 is connected to the "bottom" electrode of an adjacent cell 2, to enhance the power output of the module 1. Stated another way, the anode of one cell 2 is connected to the cathode of an adjacent cell 2.

The module 1 can be economically manufactured by forming corresponding layers of the cells 2 continuously and then cutting through certain layers as desired to divide the module 1 into individual cells 2 and provide for series connections between cells 2. The process of dividing the module layers into separate cells is referred to as "isolation" herein. Construction of the module 1 can include the following steps wherein the sequence of certain steps can be varied: forming a substantially continuous sheet of transparent electrode material on substrate 3; forming a substantially continuous sheet of photoactive material, which can include a plurality of sub-layers forming a heterojunction, on the transparent electrode sheet; cutting through the photoactive material and the transparent electrode material to expose the substrate 3 (in region A); cutting through the photoactive material to expose a portion of the transparent electrode material (in region B); forming a second substantially continuous electrode sheet over the transparent electrode material and photoactive material such that the second electrode sheet forms an electrical contact with the exposed portion of the transparent electrode material; and cutting through the second electrode sheet (in region C) to provide final separation of individual cells 2.

One problem associated with conventional methods for isolating and interconnecting cells such as described above is that it is difficult to selectively cut through certain layers without severing or damaging adjacent layers as may be desired during construction. In this regard, it will be appreciated that the individual layers of photovoltaic cells are ordinarily very thin, sometimes only several microns thick or less. Accordingly, the layer cutting techniques employed must be highly accurate. However, in order to provide a module which can compete with alternate energy sources, it is desirable to minimize construction costs. Therefore, manufacturers of photovoltaic modules have sought inexpensive yet accurate techniques for selectively cutting through module layers for isolation and interconnection and/or methods which are less sensitive to accuracy requirements.

One technique for selectively removing layers involves applying sacrificial, strippable lines of material at selected positions beneath layers which are to be removed during construction. Thus, for example, in FIG. 1, a sacrificial, strippable line of material can be applied on layer 4 in region B. This line of material can later be stripped by sandblasting or other methods thereby removing overlying layers such as the photoactive layer 5 of FIG. 1. Even though these methods may be accurate, reproducible, and controllable, the complete removal of all strippable material is still difficult and there is a limit to the optical loss minimization based on both the strippable material itself and the removal method.

In addition, known techniques for selectively removing layers in connection with cell isolation and interconnection generally result in production of relatively wide interconnecting regions between adjacent cells. For example, in one known module, the interconnection regions are at least about 0.040 inches wide due to a practical limitation in the layer removal step. The power production efficiency of a module can be enhanced by increasing the ratio of the productive surface area of the module to the total surface area of the module exposed to sunlight. Accordingly, it is desirable to reduce the width of the interconnection regions thereby increasing the proportion of the exposed module surface covered by productive photovoltaic cells.

Further, some known techniques for use in constructing modules are relatively sensitive to small errors in positioning cut lines used for cell isolation and interconnection. For example, when using such techniques, if certain cut lines are positioned too far to the left or right of the desired position, an open circuit may be formed or an insulating material may be interposed between elements intended for interconnecting cells in electrical series such that the usefulness of the entire module is greatly reduced or substantially eliminated.

SUMMARY OF THE INVENTION

Accordingly, objectives of the present invention include the following:

The provision of an improved method for isolating cells of a photovoltaic module and connecting adjacent cells in series whereby layers of the module can be selectively removed as desired substantially without severing or otherwise damaging adjacent layers.

The provision of a method for selectively removing layers of a photovoltaic module for cell isolation and interconnection which reduces or substantially eliminates the production of waste products.

The provision of a method for selectively removing layers of a photovoltaic module having a reduced sensitivity to errors in positioning cut lines associated with cell isolation and interconnection.

The provision of a photovoltaic module including a number of cells connected in series, wherein the width of the interconnection regions between cells is reduced such that a greater proportion of the exposed surface of the module can be covered with productive material (reduction of optical losses).

Further objectives and corresponding advantages of the present invention will be apparent upon consideration of the present specification.

The present invention comprises a photovoltaic module and method for constructing the same, wherein a conductive material is utilized for interconnecting adjacent cells and for protecting adjacent layers of the module against damage during layer cutting procedures. In accordance with the present invention, cell isolation and interconnection can be accomplished without cutting through overlying layers to expose a thin bottom electrode layer, thereby simplifying module construction. In addition, the present invention allows certain layer cutting procedures to be performed with a laser, diamond stylus, ultrasonic cutting needle or the like in a manner which reduces waste products and optical loss. Moreover, the present invention allows for series interconnection of adjacent cells such that the width of the interconnection region is reduced thereby enhancing module output. The present invention also allows cells to be isolated and interconnected in a manner which reduces the module's sensitivity to errors in positioning certain cut lines, i.e., the conductive material used to interconnect cells will not significantly impede current flow between cells due to small errors in cut line placement.

According to one aspect of the present invention, a method for forming a plurality of photovoltaic cells with a series connection between cells is provided. The method includes the steps of providing a substrate; establishing a first electrode on the substrate; establishing a conductor on the first electrode; establishing an active layer on the conductor; exposing a portion of the conductor covered by the active layer without severing the first electrode; establishing a second electrode over the active layer such that the second electrode contacts the exposed portion of the conductor to establish an electrical connection between the first and second electrodes via the conductor; and severing the first electrode and the second electrode to establish a first photovoltaic cell and a second photovoltaic cell.

In a preferred method, each of the steps of exposing a portion of the conductor and severing the first and second electrodes is accomplished by laser scribing, diamond stylus cutting, ultrasonic needle cutting or other layer severing techniques or combination of two or more techniques. The conductor is established by applying a line of metallic paste on top of the first electrode. The steps of establishing a first electrode, establishing an active layer and establishing a second electrode are accomplished by spray pyrolysis, dipping, electrodeposition, vacuum deposition, ambient temperature spraying or other techniques or combination of techniques.

According to another aspect of the present invention, a photovoltaic device is provided which includes a plurality of photovoltaic cells having a series interconnection between cells. The device includes at least a first cell and a second cell, separate from the first cell, formed on a substrate. Each of the first and second cells includes a lower electrode, a photoactive layer, which may include a plurality of sublayers forming a heterojunction, positioned on the lower electrode and an upper electrode adjacent to the photoactive layer. The device further includes a conductor for electrically connecting the upper electrode of the first cell to the lower electrode of the second cell wherein at least a portion of the conductor, at a point of electrical contact with the upper electrode of the first cell, is located beneath the upper electrode of the first cell. Preferably, the conductor is positioned entirely beneath the upper electrode of the first cell at a point of electrical contact therebetween.

In one embodiment, the upper electrode of the first cell extends beyond the active layer of the first cell into the interconnection region between the first and second cells. Similarly, the lower electrode of the second cell extends beyond the active layer of the second cell into the interconnection region. In this manner, the upper electrode of the first cell, the lower electrode of the second cell and the conductor are positioned in an overlapping relationship.

The conductor preferably has a thickness comparable to or greater than the thickness of the lower electrode of the second cell and, particularly, can be about 0.001 inches to 0.005 inches thick. In addition, the conductor preferably has a vaporization temperature greater than that of the overlying electrode and/or active layers and is substantially indiffusible during downstream processing steps. That is, the conductor is preferably formed from a material which does not diffuse into adjacent materials during subsequent processing. The conductor can also or alternatively be formed from a material having a hardness greater than the hardness of the overlying electrode and/or active layers.

BRIEF DESCRIPTION OF THE DRAWINGS

FIGS. 3a–3i are cross-sectional views showing the module portion of FIG. 2 at various stages during the production thereof.

DETAILED DESCRIPTION OF THE INVENTION

Figure 1:
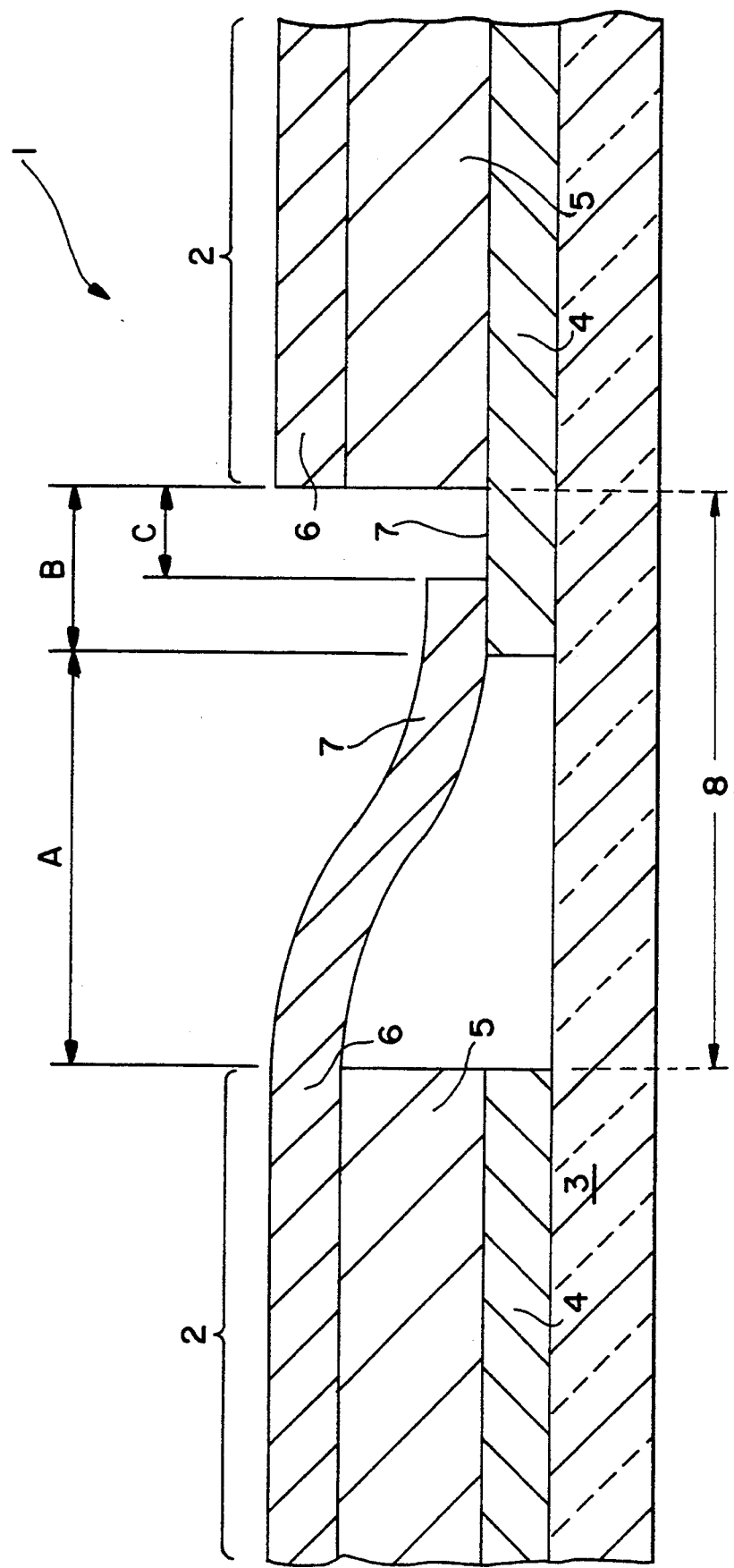
FIG. 1 is a cross-sectional view of a portion of a conventional photovoltaic device.
Figure 2:
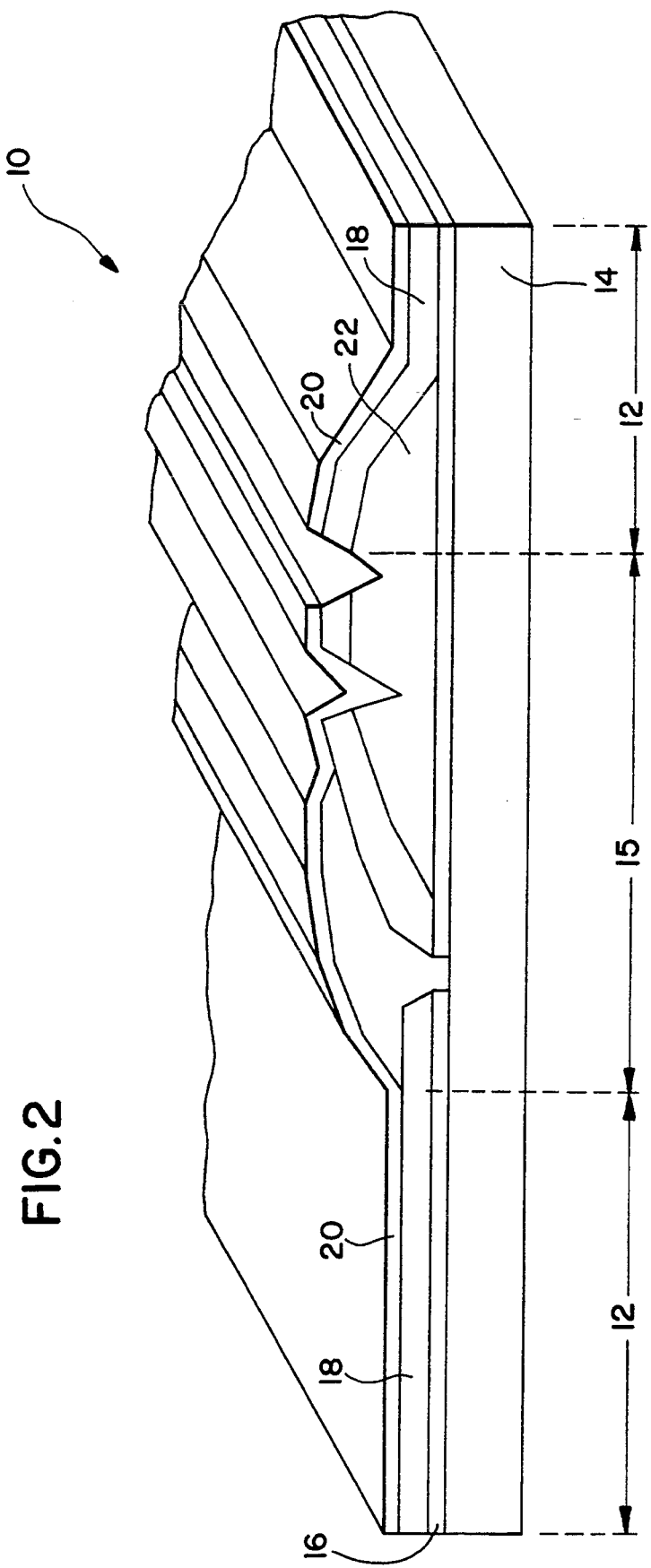
FIG. 2 is a perspective view of a portion of a photovoltaic module constructed in accordance with the present invention.

Referring to FIG. 2, a photovoltaic module constructed in accordance with the present invention is generally identified by the reference numeral 10. The module 10 comprises a plurality of photovoltaic cells 12 formed on a substrate 14 and laterally separated by interconnection regions 15. Generally, each cell 12 includes a bottom electrode 16, a photoactive layer 18 which may include p-type and n-type sublayers defining a photovoltaic junction as described below, and a top electrode layer 20. In accordance with the present invention, adjacent cells 12 are connected in electrical series by way of a conductive, buffer line 22, the functions of which will be further understood upon consideration of the description below. Although the module 10 thus depicted is fully operative to convert sunlight into electrical energy, it is anticipated that the module 10 will normally be encapsulated to prevent degradation due to exposure to water vapor. Such encapsulation can be provided in a manner known in the art.

The module 10 may be of the backwall or frontwall variety. That is, in operation, the module 10 may be disposed such that sunlight passes through the substrate 14 and bottom electrode 16 to impinge upon the active layer 18 or such that sunlight passes through the top electrode 20 to impinge thereon. It will be understood that the characteristics of the electrode layers 16 and 20 and the substrate 14, and particularly the light transmission characteristics thereof, can be varied to accommodate the module variety selected. In the illustrated embodiment, the module 10 is of the backwall variety. Accordingly, it will be appreciated that the module 10 will be inverted in use relative to the illustrated orientation such that bottom electrode 16 will be above the top electrode 20. Nevertheless, as the various layers will typically be sequentially formed on the substrate 14 using the substrate 14 as a base during construction, the term "top" and "bottom" as used herein refer to the illustrated orientation.

The present invention is applicable to various types of solar modules. In this regard, the module 10 may comprise polycrystalline silicon cells, copper-indium-diselenide polycrystalline cells; cadmium-telluride cells or other photovoltaic cells. However, it will be appreciated that the present invention is particularly advantageous as applied to modules including materials requiring special handling, such as cadmium-telluride modules, as the invention reduces or substantially eliminates the production of waste products due to layer removal steps associated with conventional techniques for isolating cells and forming series interconnections between cells.

Referring to FIGS. 3a–3i, a preferred method for constructing the module 10 is illustrated in step-by-step fashion. It should be noted that the depicted process is illustrative and the sequence of steps can be varied in accordance with the present invention. Beginning with FIG. 3a, the illustrated process involves forming successive layers on substrate 14. The substrate 14 preferably comprises an inexpensive material having a substantially flat surface for application of thin layers thereto. In addition, the substrate should comprise an insulative material or should have a surface treated to be insulative to avoid short circuits. Moreover, for backwall module applications, the substrate 14 is preferably substantially transparent to radiation in the wavelength range targeted for conversion to electrical energy. Thus, the illustrated substrate 14 comprises glass. However, other substrates, for example, certain pliable substrates, may be desired for particular applications.

Figure 3A:
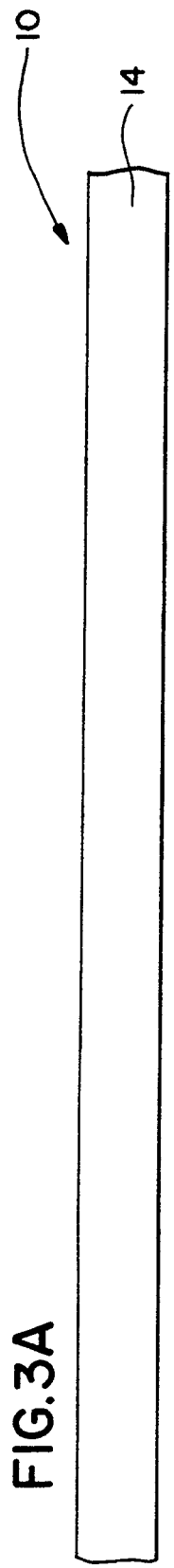
Figure 3B:
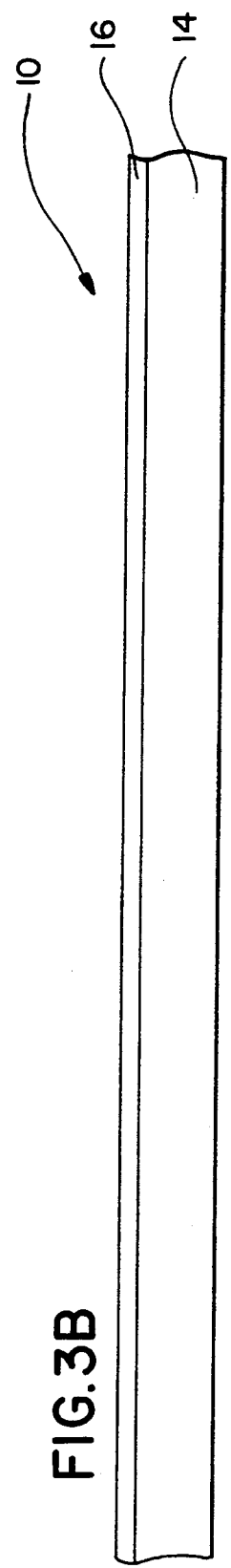

In the illustrated process, the bottom electrode layer 16 is applied to the substrate 14 as shown in FIG. 3b. The bottom electrode layer 16 can be applied by any suitable technique such as vacuum deposition, electrodeposition, dip coating, solution growth spray pyrolysis or the like. For backwall module applications, the bottom electrode layer 16 is preferably substantially transparent to radiation in the targeted wavelength range. In addition, because a primary purpose of the bottom electrode layer 16 is to pass electricity through the module 10, the layer 16 should be as highly conductive as possible. The illustrated bottom electrode layer 16 comprises tin oxide applied by spray pyrolysis which may be doped to provide desired electrical properties. The thickness of the bottom electrode layer 16 may be varied but is preferably less than about 2 microns to reduce material requirements and enhance radiation transmission.

Figure 3C:
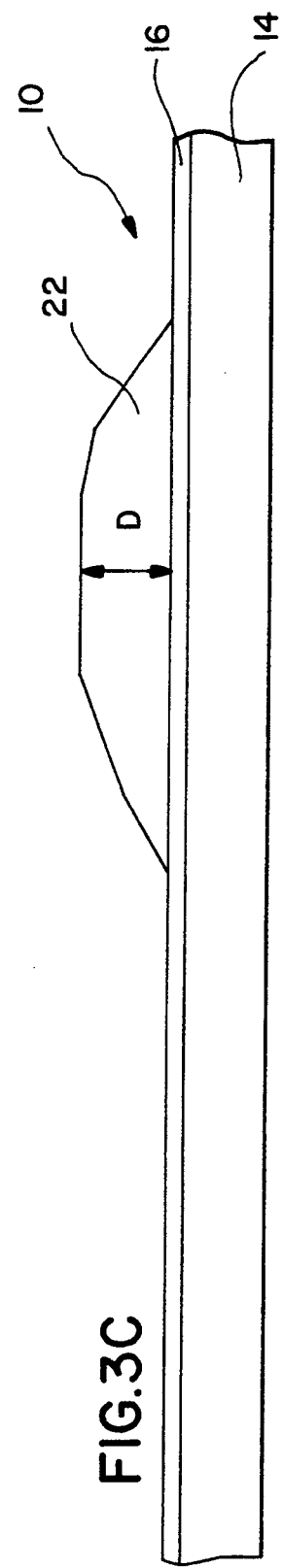

The protective buffer line 22 is formed on the bottom electrode layer 16 as shown in FIG. 3c. The buffer line 22 functions to electrically interconnect adjacent cells and protects the bottom electrode layer 16 against undesired severing during downstream layer cutting steps. Accordingly, the buffer line 22 is formed from a conductive material and preferably extends longitudinally substantially across the width of the cell. Additional characteristics of the buffer line 22 depend, for example, on the particular downstream layer cutting techniques to be employed. In this regard, the thickness of the buffer line 22 may be determined with reference to the depth cutting accuracy of the downstream cutting techniques. Preferably, the buffer line 22 is at least as thick as the bottom electrode layer 16 and, more preferably, at least as thick as the bottom electrode layer 16, active layer 18, and top electrode layer 20 combined so as to provide a cutting depth tolerance which simplifies laser scribing, diamond stylus cutting, ultrasonic needle cutting or other cutting techniques.

The material used to form the buffer line 22 is selected based on a number considerations. First, the material can be selected based on the type of downstream cutting techniques employed. For example, where a downstream laser scribing technique is employed, the material of the buffer line 22 may be selected based on its thermal properties, e.g., a material having an evaporation temperature greater than the overlying active layer 18 and top electrode layer 20 can be utilized. Similarly, the material may be selected based on its radiation absorbance characteristics at the wavelength of the cutting laser. Where the downstream cutting techniques include mechanical cutting steps such as diamond stylus cutting, a relatively hard material, e.g., a material at least as hard as the overlaying active layer 18 and top electrode layer 20 may be preferred.

In addition, the material selected for the buffer line 22 is selected based on considerations of downstream processing temperatures. It will be appreciated that downstream processing steps such as subsequent layer deposition, baking and/or crystal growth may be performed at elevated temperatures. The material of the buffer line 22 is preferably substantially dimensionally stable at such downstream processing temperatures. In this regard, the material should have a softening point at least as high as downstream processing temperatures. Moreover, the buffer line is preferably substantially indiffusible at these downstream processing temperatures. Other considerations in selecting the material of the buffer layer 22 can include the expense and ease of application of the material.

Preferred materials for use in forming the buffer line 22 include metallic pastes, e.g., nickel paste formed from powdered nickel combined with alcohol or other fluids to form an easily applied paste and heat set at 580° C., conductive oxide pastes, graphite, and combination metal/glass frits. Such materials have thermal and/or mechanical properties suitable for a variety of downstream cutting procedures including laser scribing, diamond stylus cutting and ultrasonic needle cutting. In addition, such materials are substantially stable at normal downstream processing temperatures and are highly electrically conductive. In the illustrated process, the buffer line 22 is applied by screen printing, fine needle application or other application technique and has a thickness, D, of approximately 0.001 to 0.005 inches.

The active layer 18 can be formed continuously over the buffer line 22 as shown in FIG. 3d. As noted above, many types of photovoltaic cells incorporating a variety of photoactive layers are in common use, including polycrystalline silicon cells, copper-indium-diselenide cells, cadmium-telluride cells, and other photovoltaic cells. It will thus be appreciated that the particular process steps involved in applying the active layer 18 will vary from application to application. In the illustrated embodiment, the active layer 18 includes a cadmium-sulfide collector, converter sublayer applied by spray pyrolysis or other suitable technique and a cadmium-telluride absorber, generator sublayer applied by an ambient temperature spraying or other suitable technique. Application of the active layer 18 may further involve heat treatment and crystal regrowth at temperatures as high as 550° C. or higher.

Figure 3G:
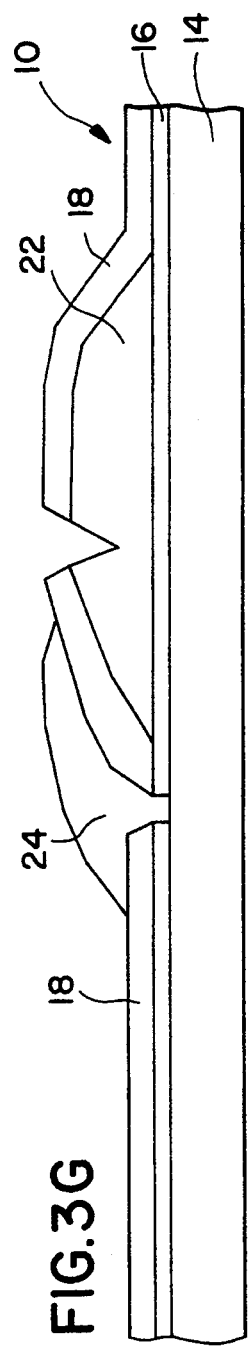

In the remaining process steps shown in FIGS. 3e–3i, adjacent cells 12 are isolated and interconnected in electrical series. As shown in FIG. 3e, a first cut line, spaced laterally from buffer line 22, is made that extends through the active layer 18 and bottom electrode 16 to substrate 14, thereby providing bottom electrode isolation of adjacent cells 12. A second cut line, as shown in FIG. 3f, is made that extends through the active layer 18 into buffer line 22 without severing bottom electrode 16. Each of these cut lines is accomplished through laser scribing, diamond styles cutting, ultrasonic needle cutting or other suitable techniques. A line of electrically resistive material 24 extending into the first cut line to substrate 14 so as to electrically insulate the bottom electrodes 16 of adjacent cells is then applied as shown in FIG. 3g. The line of resistive material is formed from a resistive paste, e.g., a paste made from a powdered resistive material such as titanium dioxide powder or other ceramic powder and alcohol or other fluids, and may be applied by screen printing, fine needle application or other suitable application technique.

Figure 3H:
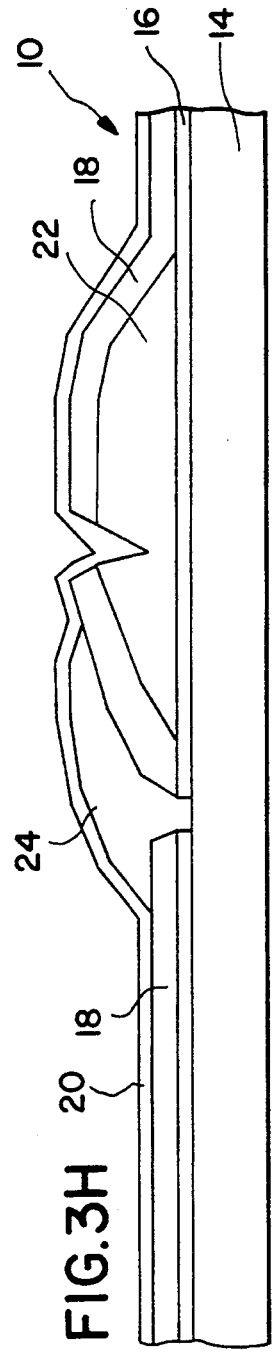
Figure 3I:
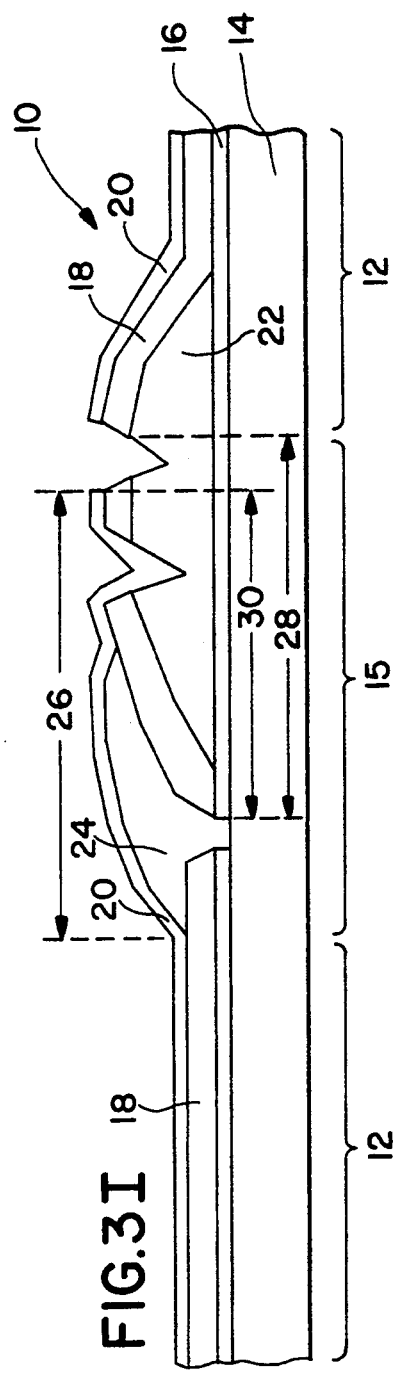

After the first and second cut lines have been made and the line of resistive material 24 has been applied, the top electrode layer 20 is continuously formed as shown FIG. 3h. The top electrode layer 20 which comprises tin or other conductive material is applied by spray pyrolysis, vacuum evaporation ambient temperature spraying, or other suitable deposition techniques. It should be noted (see FIG. 3h) that a contact portion 26 of the top electrode layer 20 of a first cell 12 thus applied extends laterally into the interconnection region 15 and into the second cut line such that the top electrode layer 20 and bottom electrode layer 16 of adjacent cells 12 are electrically interconnected via conductive buffer line 22. A third cut line, shown in FIG. 3i, extends through top electrode layer 20 and active layer 18 and into buffer line 22 without severing bottom electrode layer 16 to provide top electrode isolation of adjacent cells 12 such that the adjacent cells 12 remain connected in electrical series via buffer line 22. Again, the third cut line may be formed by laser scribing, diamond stylus cutting, ultrasonic needle cutting or other suitable cutting techniques. It will be appreciated that a contact portion 28 of the bottom electrode layer 16 of a second cell 12 underlying the buffer line 22 and extending laterally into interconnection region 15 is provided such that adjacent cells 12 are interconnected in a region of lateral overlap 30 between contact portion 26 and contact portion 28.

In summary, cell isolation and interconnection includes the steps of cutting through the bottom electrode layer 16 and applying a resistive material 24 to provide bottom electrode isolation; cutting through the photoactive layer 18 to expose buffer line 22 and applying top electrode layer 20 to provide an electrical contact between the top electrode layer 20 and bottom electrode layer 16 of adjacent cells 12; and cutting through top electrode layer 20 to provide top electrode isolation.

The present invention provides a number of advantages over conventional modules and module construction methods. First, the present invention provides a simplified and inexpensive method for isolating and interconnecting adjacent photovoltaic cells 12 relative to prior art methods. In addition, the present invention reduces the production of waste products during cell isolation and interconnection. Further, the present invention allows the lateral width of the interconnection region 15 to be reduced relative to prior art techniques for cell separation and isolating, thereby allowing for more cells 12 and more productive surface area per module 10. In this regard, it has been found that the width of region 15 can be less than 0.010 inches and particularly about 0.006 inches in accordance with the present invention. The present invention also provides a cell isolation and interconnection technique having a reduced sensitivity to errors in positioning associated cut lines. For example, small errors in positioning the lower electrode cut line may result in failure to achieve isolation of adjacent cells but generally will not result in overall module failure. Other advantages of the present invention will be apparent to those skilled in the art.

While various embodiments of the present invention have been described in detail, it is apparent that further modifications and adaptations of the invention will occur to those skilled in the art. However, it is to be expressly understood that such modifications and adaptations are within the spirit and scope of the present invention.

We claim:

1. A method for forming a plurality of photovoltaic cells with a series connection therebetween, comprising:

providing a substrate;

establishing a first electrode on top of said substrate;

establishing a protective conductor having a first thickness on top of a portion of said first electrode;

establishing an active layer having a second thickness on top of said protective conductor, said first thickness of said protective conductor being greater than said second thickness of said active layer thereby facilitating subsequent severing;

exposing a portion of said protective conductor covered by said active layer without severing the underlying portion of said first electrode;

establishing a second electrode over said active layer, said second electrode contacting said exposed portion of said protective conductor to establish an electrical connection between said first electrode and said second electrode via said protective conductor; and severing said first electrode and said second electrode to establish a first photovoltaic cell and a second photovoltaic cell.

2. The method of claim 1, wherein said step of establishing a first electrode comprises applying a layer of conductive material on said substrate.

3. The method of claim 1, wherein said step of establishing a protective conductor comprises applying a line of metallic paste, carbon paste, or conductive oxide paste on top of said first electrode.

4. The method of claim 1, wherein said step of establishing an active layer comprises applying a photoactive material by spray pyrolysis.

5. The method of claim 1, wherein said step of establishing an active layer comprises heating said active layer to promote crystal growth.

6. The method of claim 1, wherein said step of exposing comprises cutting through said active layer partly into said protective conductor.

7. The method of claim 1, wherein said step of exposing comprises mechanically cutting through said active layer.

8. The method of claim 1, wherein said step severing comprises cutting through said second electrode partly into said protective conductor.

9. The method of claim 1, wherein said step severing comprises using a laser to cut through said second electrode.

10. The method of claim 1, wherein said step of establishing a protective conductor comprises applying said protective conductor by printing or needle application.

11. The method of claim 1, further comprising the step of applying a resistive material on said substrate to electrically separate said first and second photovoltaic cells.

12. The method of claim 1, wherein said step of severing comprises dividing said first electrode into segments, and said method further comprises applying a resistive material to electrically separate said segments.

13. The method of claim 1, wherein said protective conductor has a width defined by first and second edges and said step of severing comprises forming a cut-line through said second electrode and said active layer, wherein a region of overlap between said protective conductor and said active layer remains after formation of said cutline.

14. The method of claim 1, wherein said protective conductor has a first edge adjacent to said first cell and a second edge adjacent to said second cell and said step of severing said second electrode comprises cutting through said second electrode to said protective conductor to form a cut-line, said cut-line separated from said second edge of said protective conductor by a lateral distance.

15. A method for forming a plurality of photovoltaic cells with a series connection between laterally adjacent cells, comprising:
   providing a substrate;
   establishing a first electrode on top of said substrate;
   establishing a protective conductor on top of portion of said first electrode;
   establishing an active layer on top of said protective conductor;
   severing said first electrode into electrode segments;
   applying a resistive material between said electrode segments after said step of severing;
   cutting through said active layer and partly into said protective conductor without severing the underlying portion of said first electrode;
   establishing a second electrode on top of said active layer and protective conductor; and
   cutting through said second electrode and into said protective conductor to form a cut-line without severing the underlying portion of said first electrode.

16. The method of claim 15, wherein said step of cutting through said second electrode comprises mechanically cutting said second electrode.

17. The method of claim 15, wherein said step of establishing a protective conductor comprises applying a layer of conductive material by printing or needle application.

18. The method of claim 15, wherein said step of establishing a protective conductor comprises applying conductive material having a thickness greater than the thickness of said active layer.

19. The method of claim 15, wherein said protective conductor has first and second lateral edges and said step of cutting through said second electrode comprises positioning said cut-line so that said cut-line is laterally spaced from each of said first and second lateral edges of said protective conductor.

20. The method of claim 15, wherein said step of cutting through said second electrode and into said protective conductor to form a cut-line further comprises cutting through said active layer, wherein said cut-line is positioned such that a region of overlap between said protective conductor and said active layer remains after formation of said cut-line.

21. A photovoltaic device with a plurality of photovoltaic cells having a series interconnection between adjacent cells, comprising:
   a substrate;
   a first photovoltaic cell located on said substrate, said first photovoltaic cell having a first lower electrode, a first photoactive portion positioned on said first lower electrode, and a first upper electrode adjacent to said first photoactive portion;
   a second photovoltaic cell located on said substrate and separate from said first photovoltaic cell, said second photovoltaic cell having a second lower electrode, a second photoactive portion positioned on said second lower electrode, and a second upper electrode adjacent to said second photoactive portion and separated from said first upper electrode by a cut-line; and
   a conductor, positioned between said first photovoltaic cell and said second photovoltaic cell and underlying said cut-line, directly contacting said first upper electrode at a contact point and said second lower electrode to electrically connect said first upper electrode of said first photovoltaic cell to said second lower electrode of said second photovoltaic cell to establish a series interconnection between said first photovoltaic cell and said second photovoltaic cell, at least a portion of said conductor, at said contact point located beneath said first upper electrode, said conductor having a width defined by a first edge adjacent said first photovoltaic cell and a second edge adjacent said second photovoltaic cell, said cut-line positionable at any location from said second edge to an intermediate location between said first and second edges thereby simplifying formation of said cut-line.

22. The device of claim 21, wherein said conductor is positioned entirely below said first upper electrode at a point of electrical contact therebetween.

23. The device of claim 21, wherein said second lower electrode includes a contact portion extending laterally beyond said second photoactive portion and said conductor is positioned at least partially on said contact portion.

24. The device of claim 21, wherein said first upper electrode includes a contact portion extending laterally beyond said first photoactive portion and said conductor is positioned at least partially beneath said contact portion.

25. The device of claim 21, wherein said conductor has a thickness at least as great as the thickness of said second lower electrode.

26. The device of claim 21, wherein said conductor is at least about 0.001 inches thick.

27. The device of claim 21, wherein said conductor is between about 0.001 and 0.005 inches thick.

28. The device of claim 21, wherein said conductor is formed from material having a softening point of at least about 550° C.

29. The device of claim 21, wherein said conductor is formed from material which is substantially indiffusible at downstream processing temperatures.

30. The device of claim 21, wherein said conductor is formed from material having a hardness greater than the hardness of said first upper electrode.

31. The device of claim 21, wherein said first and second cells are laterally separated by an interconnection region less than about 0.010 inches wide.

32. The device of claim 31, wherein said interconnection region is no more than 0.006 inches wide.

33. The device of claim 21, wherein said substrate is substantially transparent to radiation in the wavelength range targeted for conversion to electrical energy.

34. The device of claim 21, wherein each of said first and second photoactive portions comprises an element from group II of the periodic table.

35. The device of claim 21, wherein said conductor comprises nickel, carbon, a conductive oxide, or metal/glass frit combinations.

36. The device of claim 21, wherein said first upper electrode directly contacts said first photoactive portion.

37. The device of claim 21, further comprising a resistive material extending from said first lower electrode to said second lower electrode to electrically separate said first and second lower electrodes.

38. The device of claim 21, wherein said conductor has a thickness greater than a thickness of said second photoactive portion.

39. The device of claim 21, wherein said intermediate location coincides with said contact point.

40. The device of claim 11, wherein said cutline is separated from said second terminal edge by a lateral distance.

41. The device of claim 21, wherein said second photoactive portion laterally overlaps said conductor.

42. A photovoltaic device, comprising:
a first photovoltaic cell established on a substrate, said first photovoltaic cell comprising a first upper electrode, a first photoactive layer interposed between said first upper electrode and said substrate, and a first lower electrode interposed between said first photoactive layer and said substrate, said first upper electrode including a first contact portion;
a second photovoltaic cell established on said substrate and laterally spaced from said first photovoltaic cell thereby defining an interconnect region between said first and second photovoltaic cells, said second photovoltaic cell comprising a second upper electrode, a second photoactive layer interposed between said second upper electrode and said substrate, and a second lower electrode interposed between said second photoactive layer and said substrate, said second lower electrode including a second contact portion, said first contact portion and said second contact portion extending into said interconnect region and disposed in a spaced, laterally overlapping relationship in said interconnect region; and
a conductor for use in electrically interconnecting said first and second cells, said conductor contacting said first contact portion and said second contact portion in said interconnect region to establish an electrical connection therebetween, said conductor underlying a sufficient portion of said second photoactive layer such that the relative positioning of said second photoactive layer and said conductor allows for flexibility in locating said interconnect region.

43. The device of claim 42, further comprising a resistive material extending from said first lower electrode to said second lower electrode to electrically separate said first and second lower electrodes.

44. The device of claim 42, wherein said conductor has a thickness greater than a thickness of said second photoactive layer.

* * * * *